(12) United States Patent
Wada (10) Patent No.: US 7,091,748 B2
(45) Date of Patent: Aug. 15, 2006

(54) SEMICONDUCTOR INTEGRATED CIRCUIT

(75) Inventor: Osamu Wada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/945,094

(22) Filed: Sep. 21, 2004

(65) Prior Publication Data

US 2005/0036134 A1    Feb. 17, 2005

Related U.S. Application Data

(62) Division of application No. 10/315,103, filed on Dec. 10, 2002, now Pat. No. 6,809,554.

(30) Foreign Application Priority Data

Sep. 20, 2002 (JP) ............................. 2002-275561

(51) Int. Cl.
*H03K 19/0175* (2006.01)
(52) U.S. Cl. .......................................... 326/81; 326/86
(58) Field of Classification Search ............ 326/80–83, 326/86–87, 62–63, 68; 327/108, 333
See application file for complete search history.

(56) References Cited

U.S. PATENT DOCUMENTS

| | | | |
|---|---|---|---|
| 5,952,847 A | 9/1999 | Plants et al. | |
| 6,067,257 A | 5/2000 | Kitsukawa et al. | |
| 6,249,145 B1 | 6/2001 | Tanaka et al. | |
| 6,307,397 B1 | 10/2001 | Mueller et al. | |
| 6,359,471 B1 * | 3/2002 | Mueller et al. | 326/81 |
| 6,501,301 B1 * | 12/2002 | Taguchi | 326/101 |

* cited by examiner

*Primary Examiner*—James H. Cho
(74) *Attorney, Agent, or Firm*—Oblon, Spivak, McClelland, Maier & Neustadt, P.C.

(57) ABSTRACT

A semiconductor integrated circuit includes a first logic circuit to which a first power supply voltage is applied and which outputs a first signal, a first level conversion circuit to which the first power supply voltage and a second power supply voltage having an amplitude of second voltage level different from the first power supply voltage are supplied and which outputs a second signal, a second logic circuit to which the second power supply voltage is applied and which outputs a third signal, and a second level conversion circuit which is connected between the first and second logic circuits, to which the first and second power supply voltages are applied, and which level-converts the third signal of the second voltage level output from the second logic circuit to the first voltage level and outputs a fourth signal.

4 Claims, 5 Drawing Sheets

SEMICONDUCTOR INTEGRATED CIRCUIT

CROSS-REFERENCE TO RELATED APPLICATIONS

This application is a division of and claims the benefit of priority under 35 USC §120 from U.S. application Ser. No. 10/315,103, filed Dec. 10, 2002, now U.S. Pat. No. 6,809,554, and is based upon and claims the benefit of priority under 35 USC §119 from Japanese Patent Application No. 2002-275561, filed Sep. 20, 2002, the entire contents of which are incorporated herein by reference.

BACKGROUND OF THE INVENTION

1. Field of the Invention

The present invention relates to a semiconductor integrated circuit and, more particularly, to a semiconductor integrated circuit having a voltage level conversion circuit and at least two types of logic circuit elements that operate at power supply voltages having different values.

2. Description of the Related Art

With the trend toward smaller semiconductor integrated circuits, in order to ensure the reliability of internal circuit elements and reduce the power consumption it is preferable to decrease the supply voltage. At a low supply voltage, however, an internal circuit cannot be operated at a high speed or a write cannot be sufficiently done in memory cells. The above requirements for reliability and low power consumption can be achieved by applying a high power supply voltage to a necessary portion of a semiconductor integrated circuit and operating it.

Since power supply voltages having different values are applied to a single semiconductor integrated circuit, and circuits designed to perform logic processing at different signal levels are mounted together, a level conversion circuit for converting signal levels is required between the two circuits.

In a conventional semiconductor integrated circuit including a level conversion circuit, an output signal from a logic circuit to which a lower power supply voltage is applied is input to the level conversion circuit to which two types of power supply voltages, i.e., higher and lower voltages, are applied, the level conversion circuit converts the amplitude of the output signal having a level corresponding to the lower power supply voltage to the amplitude corresponding to the higher power supply voltage, and the resultant voltage signal is output to the circuit that operates at the higher power supply voltage (see, for example, U.S. Pat. No. 6,067,257 (Page 1, FIG. 7)

With the recent trends toward mobile electronic devices, a specified voltage may not always be applied to such a semiconductor integrated circuit having different power supply voltage levels when a power supply voltage is applied from a battery exhausted upon discharging or from a charging power supply or a shock, vibration, or the like is given to a power supply circuit including a battery. More specifically, when the higher power supply voltage becomes unstable, the voltage will be lowered to a value lower than that of the lower power supply voltage. Alternatively, the connection terminal of the lower voltage supply may undergo unstable contact, and the power supply may be instantaneously interrupted or stopped.

A fluctuant power supply voltage lower than the minimum level required to determine a logical operation may therefore be applied to a logic circuit element. As a consequence, the logic operation of the logic circuit element becomes unstable. In this case, for example, the conduction state of transistors forming an inverter formed of a CMOS circuit may become unstable, and a leakage current may flow across the power supply terminals of this inverter via the CMOS circuit. As described above, leakage current may flow in various portions of a semiconductor integrated circuit due to unstable power supply voltages, and hence operation errors and increases in power consumption have not been prevented.

Figure 8A:
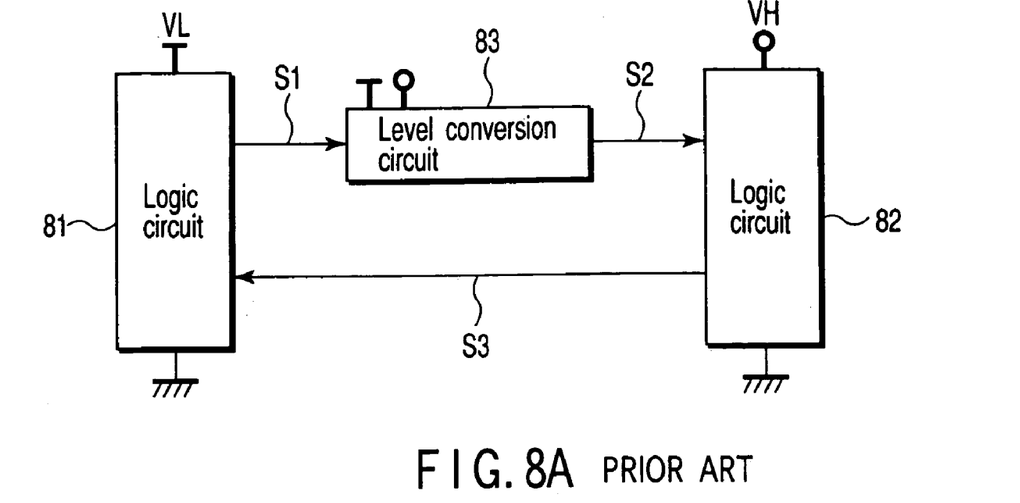
FIG. 8A is a block diagram showing the overall arrangement of a conventional semiconductor integrated circuit.

A conventional semiconductor integrated circuit including a level conversion circuit will be described below with reference to FIGS. 8A and 8B. FIG. 8A shows a block diagram of a semiconductor integrated circuit having a level conversion circuit 83 between a logic circuit 81 to which a power supply voltage VL is applied and a logic circuit 82 to which a power supply voltage VH is applied. The power supply voltage VH is higher than the power supply voltage VL.

This semiconductor integrated circuit includes the logic circuit 81 to which the power supply voltage VL is applied and which outputs a signal S1 having the amplitude corresponding to the power supply voltage VL, the level conversion circuit 83 which is connected to the logic circuit 81, to which the power supply voltages VL and VH are applied, and which converts the input signal S1 into a signal S2 having the amplitude corresponding to the power supply voltage VH and outputs the signal S2, and the logic circuit 82 to which the power supply voltage VH is applied and which outputs a signal S3 having the amplitude corresponding to the power supply voltage VH. A simple logic element (to be referred to as an H•L conversion logic element hereinafter) such as an inverter, NAND circuit, or NOR circuit (not shown) for level-converting the signal S3 into a signal having the amplitude corresponding to the power supply voltage VL is further connected to the input stage of the logic circuit 81.

Assume that in this case, the logic circuits 81 and 82 include CMOS inverters which are constituted by PMOS and NMOS transistors and receive input signals at their commonly connected gates.

Figure 8B:
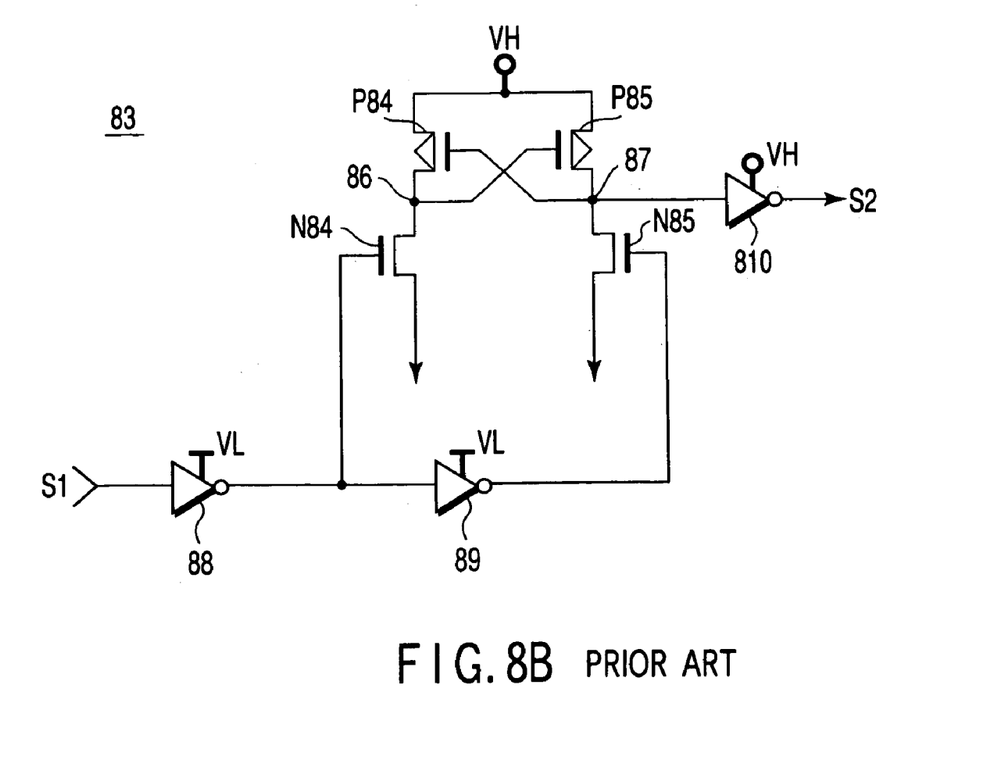
FIG. 8B is a circuit diagram showing an example of the arrangement of a level conversion circuit used in the conventional semiconductor integrated circuit of FIG. 8A.

FIG. 8B is a circuit diagram showing an example of the level conversion circuit 83. The level conversion circuit 83 includes a latch circuit. This latch circuit is comprised of PMOS transistors P84 and P85 having source terminals to which the power supply voltage VH is applied and gate terminals and drain terminals which are cross-connected to each other, an NMOS transistor N84 having a drain terminal connected to ground and a source terminal connected to the drain terminal of the PMOS transistor P84 and the gate terminal of the PMOS transistor P85 at a node 86, and an NMOS transistor N85 having a drain terminal connected to ground and a source terminal connected to the drain terminal of the PMOS transistor P85 and the gate terminal of the PMOS transistor P84 at a node 87.

The level conversion circuit 83 is further comprised of an inverter 88 to which the power supply voltage VL is applied and which has an output terminal to which the gate terminal of the NMOS transistor N84 and the input terminal of an inverter 89 are connected and outputs the signal obtained by inverting the logic of the input signal S1, the inverter 89 which outputs the signal obtained by inverting an input signal from the inverter 88 to the gate terminal of the NMOS transistor N85, and an inverter 810 to which the power supply voltage VH is applied and which outputs the signal S2 obtained by inverting the logic of an input signal from the node 87.

The operation of the semiconductor integrated circuit including the level conversion circuit 83 shown in FIGS. 8A and 8B will be described next.

Conversion (to be referred to as L•H conversion hereinafter) from the signal S1 having the amplitude corresponding to the power supply voltage VL to the signal S2 having the amplitude corresponding to the power supply voltage VH will be described first with reference to FIG. 8B. When the signal S1 having high level (to be referred to as logic-H hereinafter) of the power supply voltage VL is input to the level conversion circuit 83, the logic-H signal S1 is inverted into a signal having low level (to be referred to as logic-L hereinafter) by the inverter 88. This signal is output to the NMOS transistor N84 and inverter 89. The logic-L signal input to the gate terminal of the NMOS transistor N84 turns off the NMOS transistor N84.

The logic-L signal input to the inverter 89 is inverted into a logic-H signal having the amplitude VL. This signal is input to the gate terminal of the NMOS transistor N85 to turn on the NMOS transistor N85. The potential of the node 87 is then pulled down to low level to turn on the PMOS transistor P84 having the gate terminal to which the potential of the node 87 is input. The potential of the node 86 is set at high level to turn off the PMOS transistor P85 having the gate terminal to which the potential of the node 86 is input. Therefore, the logic-L signal is input to the inverter 810 having an input terminal to which the node 87 is connected, and the inverter 810 outputs an inverted high level signal having the amplitude corresponding to the power supply voltage VH.

When the logic-L signal S1 having the amplitude corresponding to the power supply voltage VL is input to the level conversion circuit 83, the logic-L signal S1 is inverted into a logic-H signal by the inverter 88. This signal is output to the NMOS transistor N84 and inverter 89. The logic-H signal input to the gate terminal of the NMOS transistor N84 turns on the NMOS transistor N84. On the other hand, the logic-H signal input to the inverter 89 is inverted into a logic-L signal. This signal is input to the gate terminal of the NMOS transistor N85 to turn off the NMOS transistor N85.

The potential of the node 87 is then set at high level to turn off the PMOS transistor P84 having the gate to which the potential of the node 87 is input. The potential of the node 86 is pulled down to low level to turn on the PMOS transistor P85 having the gate to which the potential of the node 86 is input. Therefore, a high-level signal is input to the inverter 810 having an input terminal connected to the node 87, and the inverter 810 outputs the low-level signal S2 having the same amplitude as that of the power supply voltage VH.

H-L conversion from the amplitude corresponding to the power supply voltage VH to the amplitude corresponding to the power supply voltage VL will be described. The power supply voltage VH is higher than the power supply voltage VL, and the amplitude corresponding to the voltage of a signal input to the logic circuit 81 which operates with the low voltage VL is sufficiently large. Since sufficient signal level is ensured in the logic circuit 81 by this input signal, no latch circuit for fixing logic is required. Therefore, the H•L conversion logic element connected to the first stage of the logic circuit 81 is sufficient in terms of operation, accurate logic operation can be expected without using a level conversion circuit like the circuit 83 shown in FIG. 8B as long as the power supply voltages VL and VH are normal.

Operation to be performed when the power supply voltage VH is unstable, and temporarily becomes lower than the power supply voltage VL will be described. In the level conversion circuit 83, the signal S1 from the logic circuit 81 to which the power supply voltage VL is applied is input to the inverter 88, and hence the signal S1 having the amplitude corresponding to the power supply voltage VL having normal logic level is input. However, since the power supply voltage VH applied to the latch circuit 83 is unstable, the potential of the node 87 to which the unstable power supply voltage VH is applied is also unstable. As a consequence, a logic-undefined signal is supplied to the inverter 810 having the input terminal connected to the node 87. With this operation, a leakage current may flow in the inverter 810 constituted by a CMOS circuit. In addition, since the power supply voltage VH applied to the inverter 810 is unstable, the potential state of the output signal S2 becomes unstable, and the logic-undefined signal S2 may be output.

This logic-undefined signal S2 is input to the logic circuit 82. For this reason, a leakage current may flow in the CMOS inverter and the like in the logic circuit 82. In addition, since the unstable power supply voltage VH is applied, the potential state of an output signal becomes unstable, and the logic-undefined signal S3 is output.

This logic-undefined signal S3 is input to the H•L conversion logic element (not shown) connected to the first stage of the logic circuit 81. If, for example, this logic element is a CMOS inverter, since the logic-undefined signal S3 is input, a leakage current may flow. In addition, the logic-undefined signal S3 is output to the logic circuit 81, and a leakage current also may flow in the logic circuit 81.

As described above, a leakage current flows in the level conversion circuit 83, logic circuit 82, the H•L conversion logic element, and logic circuit 81, resulting in an increase in the power consumption of the overall semiconductor integrated circuit.

Operation to be performed when the lower power supply voltage VL is unstable and instantaneously interrupted or stopped will be described. In this case, since the unstable power supply voltage VL is applied to the logic circuit 81, the logic-undefined signal S1 is output. This logic-undefined signal S1 is input to the level conversion circuit 83. Since this logic-undefined signal S1 is input, a leakage current flows in the inverter 88. Since the unstable power supply voltage VL is applied to the logic circuit 81, a logic-undefined signal is output. This logic-undefined signal is input to the gate terminal of the NMOS transistor N84. As a consequence, the conduction state of the NMOS transistor N84 becomes unstable.

Since the unstable power supply voltage VL is also applied to the inverter 89 in the same manner, a logic-undefined signal is output. This logic-undefined signal is input to the gate terminal of the NMOS transistor N85, and the conduction state of the NMOS transistor N85 becomes unstable. That is, the relationship in conduction state between the NMOS transistors N84 and N85 becomes unstable, and hence the two transistors may be simultaneously turned on. As a result, the node 86 or 87 is set in a low state, and both the PMOS transistors P84 and P85 may be turned on at once. Therefore, a leakage current flows in the latch circuit. In addition, since the logic-undefined signal can be input to the inverter 810, a leakage current flows, and the logic-undefined signal S2 is output.

Since this logic-undefined signal S2 is input to the logic circuit 82, a leakage current flows in the logic circuit 82, and the logic-undefined signal S3 is output.

Furthermore, a leakage current also flows in the simple logic element which is connected to the first stage of the logic circuit 81 and to which the power supply voltage VL is applied, and a logic-undefined signal is output. As a consequence, a leakage current also flows in the logic circuit 81.

The power consumption due to a leakage current generated by an element to which the higher power supply voltage VH is applied as an operating voltage, in particular, increases.

As described above, owing to the possibility that a leakage current will be generated by a semiconductor integrated circuit, a leakage current undesirably flows in the overall circuit although a circuit designed for a mobile device should be a low-power-consumption circuit.

BRIEF SUMMARY OF THE INVENTION

According to one aspect of the present invention, there is provided a semiconductor integrated circuit comprising:

a first logic circuit to which a first power supply voltage having a first amplitude is applied and which outputs a first signal having the first amplitude;

a first level conversion circuit to which the first power supply voltage and a second power supply voltage having a second amplitude different from the first amplitude are supplied and which converts levels of the first signal from the first amplitude to the second amplitude and outputs a second signal;

a second logic circuit to which the second power supply voltage having the second amplitude is applied and which outputs a third signal having the second amplitude; and a second level conversion circuit which is connected between the first and second logic circuits, to which the first and second power supply voltages are applied, and which converts the third signal having the second amplitude output from the second logic circuit into a fourth signal having the first amplitude.

According to another aspect of the present invention, there is provided a semiconductor integrated circuit comprising:

a first logic circuit to which a first power supply voltage having a first amplitude is applied and which outputs a first signal having the first amplitude;

a power supply voltage detecting circuit to which the first power supply voltage and a second power supply voltage having a second amplitude larger than the first amplitude are applied and which outputs a detection signal representing level states of the first and second power supply voltages;

a level conversion circuit section to which the first and second power supply voltages are applied and which converts the first signal input from the first logic circuit into a second signal having the second amplitude and outputs a switching control signal on the basis of the detection signal;

an internal circuit which operates at the first power supply voltage; and a switching circuit which is connected in series with the internal circuit across a power supply voltage terminals of first power supply voltage and operates in accordance with the switching control signal from the level conversion circuit, wherein when the detection signal output from the power supply voltage detecting circuit indicates a voltage fluctuations of one of the first and second power supply voltages, the level conversion circuit section outputs a signal which opens the switching circuit.

DETAILED DESCRIPTION OF THE INVENTION

The embodiments of the present invention will be described below with reference to the several views of the accompanying drawing.

Figure 1:
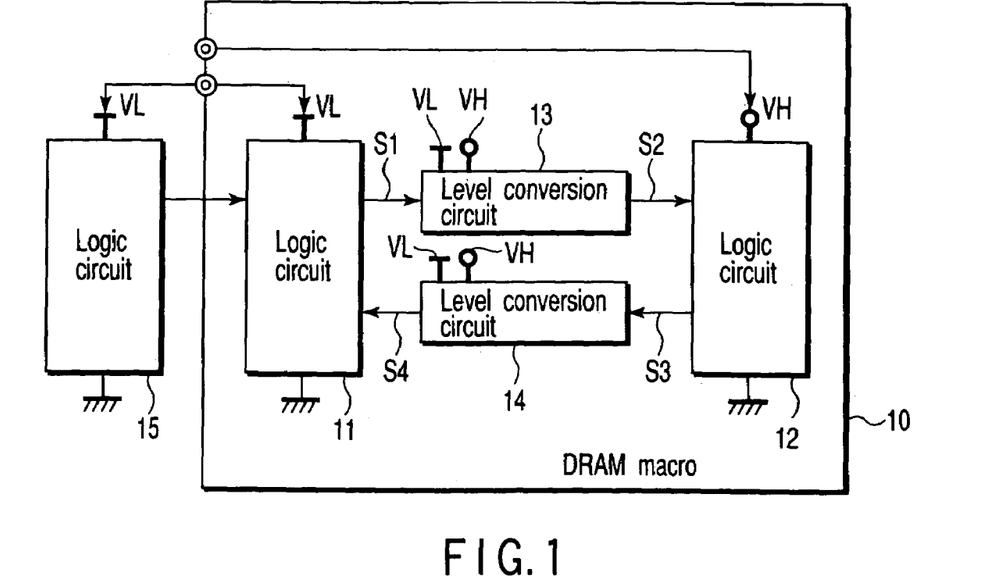
FIG. 1 is a block diagram showing the arrangement of a semiconductor integrated circuit according to the first embodiment of the present invention.

FIG. 1 is a block diagram showing the arrangement of the first embodiment. As in FIG. 8, in FIGS. 1 to 7, for the sake of easy understanding, each power supply terminal to which a first power supply voltage VL is applied is indicated by the bar "-", whereas each power supply terminal to which a second power supply voltage VH is applied is indicated by a hollow bullet. The second power supply voltage VH is higher than the first power supply voltage VL. The circuit shown in FIG. 4 has a power supply terminal to which an intermediate voltage VM between these voltages is applied, which is indicated by the bullet.

As shown in FIG. 1, the semiconductor integrated circuit of the first embodiment is, for example, a DRAM macro 10 formed on a silicon substrate, for example, to which the power supply voltages VL and VH are externally applied. This DRAM macro 10 is comprised of a logic circuit 11 to which the power supply voltage VL is applied and which outputs a signal S1 having the amplitude corresponding to the power supply voltage VL, a level conversion circuit 13 to which the power supply voltages VL and VH are applied and which converts the signal S1 input from the logic circuit 11 and having the amplitude corresponding to the power supply voltage VL into a signal S2 having the amplitude corresponding to the power supply voltage VH, a logic circuit 12 to which the power supply voltage VH is applied and which outputs a signal S3 having the amplitude corresponding to the power supply voltage VH, and a level conversion circuit 14 to which the power supply voltages VL and VH are applied and which converts the signal S3 having the amplitude corresponding to the power supply voltage VH into a signal S4 having the amplitude corresponding to the power supply voltage VL.

A logic circuit 15 to which the power supply voltage VL is applied and which is directly connected to the logic circuit 11 to exchange signals is formed outside the DRAM macro 10 within the same semiconductor substrate.

Note that the logic circuit 11 may include a control circuit for controlling the DRAM macro 10, a decoding circuit for decoding addresses in a memory device, and the like, and the logic circuit 12 may include an internal power generating circuit, sense amplifier, and the like. The logic circuit 15 includes, for example, an address buffer circuit.

Figure 2:
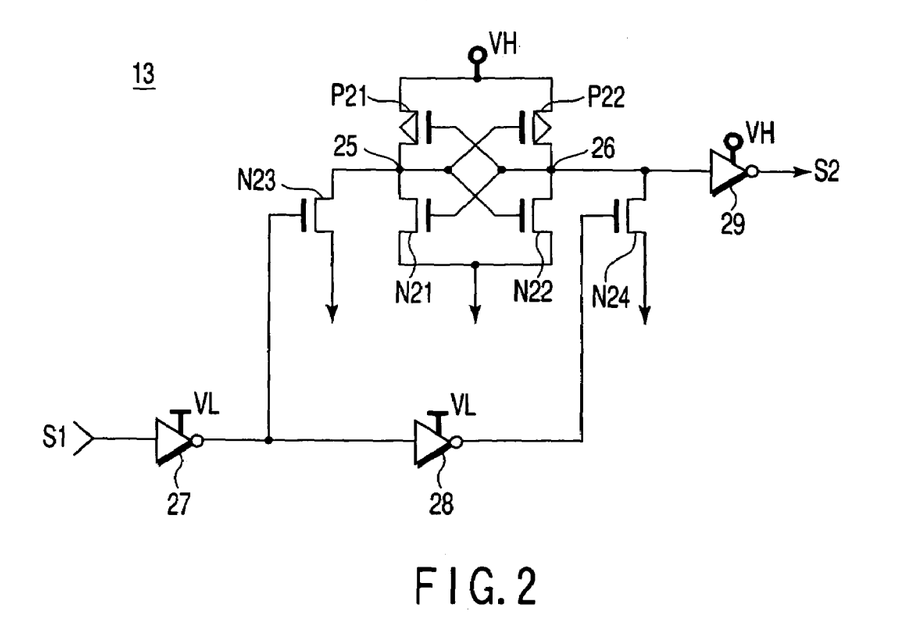
FIG. 2 is a circuit diagram showing the arrangement of a level conversion circuit used in the first embodiment shown in FIG. 1.

FIG. 2 is a circuit diagram showing an example of the circuit arrangement of the level conversion circuit 13 for performing L•H conversion. A full latch circuit included in this level conversion circuit 13 is comprised of two PMOS transistors P21 and P22 and two NMOS transistors N21 and N22. That is, a high voltage terminal of the power supply voltage VH is connected to the sources of the PMOS transistors P21 and P22. At a node 25, the gates of the NMOS transistor N22 and PMOS transistor P22 and the drains of the PMOS transistor P21 and NMOS transistor N21 are connected to each other. At a node 26, the gates of the NMOS transistor N21 and PMOS transistor P21 and the drains of the PMOS transistor P22 and NMOS transistor N22 are connected to each other. The sources of the NMOS transistors N21 and N22 are connected to ground.

The node 25 side of this full latch circuit is connected to the source of an NMOS transistor N23. The gate of the transistor N23 is connected to the output terminal of an inverter 27 to which the signal S1 is input from the input terminal.

The output terminal of the inverter 27 to which the power supply voltage VL is applied is connected to the input terminal of an inverter 28 to which the power supply voltage VL is applied. The output terminal of the inverter 28 is connected to the gate of an NMOS transistor N24. The drain of the transistor N24 is connected to the node 26, and the source is grounded. This node 26 is connected to the input terminal of an inverter 29 to which the power supply voltage VH is applied.

Figure 3:
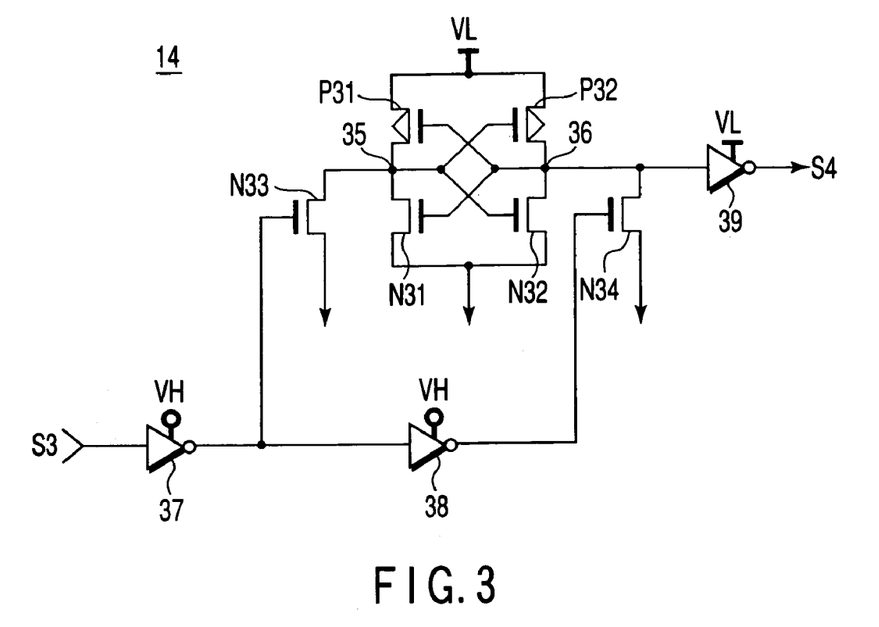
FIG. 3 is a circuit diagram showing an example of the arrangement of another level conversion circuit used in the first embodiment shown in FIG. 1.

FIG. 3 shows an example of the circuit diagram of the level conversion circuit 14 for performing H•L conversion. A full latch circuit included in this level conversion circuit 14 is comprised of PMOS transistors P31 and P32 and NMOS transistors N31 and N32.

A high voltage power supply terminal of the power supply voltage VL is connected to the sources of the PMOS transistors P31 and P32. At a node 35, the gates of the NMOS transistor N32 and PMOS transistor P32 and the drains of the PMOS transistor P31 and NMOS transistor N31 are connected to each other. At a node 36, the gates of the NMOS transistor N31 and PMOS transistor P31 and the drains of the PMOS transistor P32 and NMOS transistor N32 are connected to each other. The sources of the NMOS transistors N31 and N32 are grounded.

The node 35 side of this full latch circuit is connected to the drain of an NMOS transistor N33. The gate of the NMOS transistor N33 is connected to the output terminal of an inverter 37 to which the signal S3 is input from the input terminal.

The output terminal of the inverter 37 to which the power supply voltage VH is applied is connected to the input terminal of an inverter 38 to which the power supply voltage VH is applied. The output terminal of this inverter 38 is connected to the gate of an NMOS transistor N34, the drain is connected to the node 36, and the source is grounded. This node 36 is connected to the input terminal of an inverter 39 to which the power supply voltage VL is applied.

The operation of the semiconductor integrated circuit according to the first embodiment will be described with reference to FIGS. 1 to 3.

L•H conversion will be described first by exemplifying the level conversion circuit 13 in FIG. 2.

When the high-level signal S1 having the amplitude corresponding to the power supply voltage VL is input from the logic circuit 11 to the level conversion circuit 13, the signal inverted into logic L by the inverter 27 is supplied to the NMOS transistor N23 and inverter 28. The logic-L signal input to the gate of the NMOS transistor N23 turns off the NMOS transistor N23.

The logic-L signal input to the input terminal of the inverter 28 is inverted into a logic-H signal. This signal is input to the gate of the NMOS transistor N24 to turn on the NMOS transistor N24. As a consequence, the node 26 connected to the drain of the NMOS transistor N24 is pulled down to low level, and the PMOS transistor P21 having a gate to which the potential of the node 26 is input is turned on. At the same time, the NMOS transistor N21 having a gate to which the potential of the node 26 is input is turned off.

In addition, the potential of the node 25 is pulled up to high level corresponding to the power supply voltage VH. As a result, the PMOS transistor P22 having a gate to which the potential of the node 25 is input is turned off. At the same time, the NMOS transistor N22 having a gate to which the potential of the node 25 is input is turned on. Therefore, a low-level signal having the amplitude corresponding to the power supply voltage VH is supplied to the inverter 29 having an input terminal connected to the node 26, and the inverter 29 outputs the inverted logic-H signal S2.

When the low-level signal S1 having the amplitude corresponding to the power supply voltage VL is input from the logic circuit 11 to the level conversion circuit 13, the signal inverted into logic H by the inverter 27 is input to the NMOS transistor N23 and inverter 28. The logic-H signal input to the gate of the NMOS transistor N23 turns on the NMOS transistor N23.

The logic-H signal input to the input terminal of the inverter 28 is inverted into logic L signal. This signal is input to the gate of the NMOS transistor N24 to turn off the NMOS transistor N24. As a consequence, the potential of the node 26 connected to the drain of the NMOS transistor N24 is pulled up to high level corresponding to the power supply voltage VH. Therefore, the PMOS transistor P21 having a gate to which the potential of the node 26 is input is turned off. At the same time, the NMOS transistor N21 having a gate to which the potential of the node 26 is input is turned on.

The node 25 is pulled down to low level, and the PMOS transistor P22 having a gate to which the potential of the node 25 is input is turned on. At the same time, the NMOS transistor N22 having a gate to which the potential of the node 25 is input is turned off. Therefore, a high-level signal having the amplitude corresponding to the power supply voltage VH is output to the inverter 29 connected to the input terminal of the node 26, and the inverter 29 outputs the inverted logic-L signal S2.

H•L conversion will be described next by exemplifying the level conversion circuit 14 in FIG. 3.

When the high-level signal S3 having the amplitude corresponding to the power supply voltage VH is input from the logic circuit 12 to the level conversion circuit 14, the signal inverted into logic L by the inverter 37 is supplied to the NMOS transistor N33 and inverter 38. The NMOS transistor N33 is turned off by the logic-L signal input to its gate.

The logic-L signal input to the input terminal of the inverter 38 is inverted into a logic-H signal. This signal is input to the gate of the NMOS transistor N34 to turn on the NMOS transistor N34. As a consequence, the node 36 connected to the drain of the NMOS transistor N34 is pulled down to low level, and the PMOS transistor P31 having a gate to which the potential of the node 36 is input is turned on. At the same time, the NMOS transistor N31 having a gate to which the potential of the node 36 is input is turned off.

In addition, the potential of the node 35 is pulled up to high level corresponding to the power supply voltage VL. The PMOS transistor P32 having a gate to which the potential of the node 35 is input is turned off. At the same time, the NMOS transistor N32 having a gate to which the potential of the node 35 is input is turned on. Therefore, a low-level signal having the amplitude corresponding to the power supply voltage VL is applied to the inverter 39 connected to the input terminal of the node 36, and the inverter 39 outputs the inverted logic-H signal S4.

When the low-level signal S3 having the amplitude corresponding to the power supply voltage VH is input from the logic circuit 12 to the level conversion circuit 14, the signal inverted into logic H by the inverter 37 is input to the NMOS transistor N33 and inverter 38. The NMOS transistor N33 is turned on by the logic-H signal input to its gate.

The logic-H signal input to the input terminal of the inverter 38 is inverted into logic L signal. This signal is input to the gate of the NMOS transistor N34 to turn off the NMOS transistor N34. As a consequence, the potential of the node 36 connected to the drain of the NMOS transistor N34 is pulled up to high level corresponding to the power supply voltage VL. Therefore, the PMOS transistor P31 having a gate to which the potential of the node 36 is input is turned off. At the same time, the NMOS transistor N31 having a gate to which the potential of the node 36 is input is turned on.

In addition, the node 35 is pulled down to low level, and the PMOS transistor P32 having a gate to which the potential of the node 35 is input is turned on. At the same time, the NMOS transistor N32 having a gate to which the potential of the node 35 is input is turned off. Therefore, a high-level signal having the amplitude corresponding to the power supply voltage VL is output to the inverter 39 connected to the input terminal of the node 36, and the inverter 39 outputs the inverted logic-L signal S4.

Operation to be performed when the value of either the power supply voltage VH or the power supply voltage VL has been fluctuated will be described If the power supply voltage VL is unstable and undergoes a change or a fluctuation, e.g., an instantaneous interruption or stop, the logic circuit 11 to which the power supply voltage VL is applied outputs the logic-undefined signal S1 to the level conversion circuit 13. Since the unstable power supply voltage VL is applied to the inverters 27 and 28, they output logic-undefined signals. For this reason, the conduction states of the NMOS transistors N23 and N24 become undefined, the potentials of the nodes 25 and 26 also become undefined. The full latch circuit of the level conversion circuit 13 can, however, converge even a slight potential difference between the nodes 25 and 26, if any, in a direction to increase, these nodes 25 and 26 can maintain potential states in the opposite directions.

The operation of this full latch circuit will be described. When, for example, the NMOS transistors N24 and N23 are simultaneously turned on, since the node 26 is pulled down to low level by the NMOS transistor N24 on the output side, a low-level signal having the amplitude corresponding to the power supply voltage VH is output to the inverter 29.

When the NMOS transistors N24 and N23 are simultaneously turned off, both the nodes 25 and 26 are set in a floating state. In this case, if there is at least a slight potential difference between the nodes 25 and 26, the full latch circuit converges the potential difference in a direction to increase, and the node 26 outputs a signal having either H level or L level corresponding to the amplitude of the power supply voltage VH. Since the normal specified voltage VH is applied to the inverter 29, it normally operates. Therefore, the level conversion circuit 13 outputs the signal S2 whose logic is fixed to either H level or L level which is not affected by variations in power supply voltage.

If the power supply voltage VH is unstable and undergoes a change, e.g., becoming lower than the power supply voltage VL, the logic circuit 12 to which the power supply voltage VH is applied outputs the logic-undefined signal S3. This signal S3 is input to the level conversion circuit 14. Since the unstable power supply voltage VH is applied to the inverters 37 and 38, they also output logic-undefined signals. For this reason, the conduction states of the NMOS transistors N33 and N34 become unstable, and the potentials of the nodes 35 and 36 also become unstable. As long as there is at least a slight potential difference between the nodes 35 and 36, a full latch circuit of the level conversion circuit 14 can converge the potential difference in a direction to increase, the nodes 35 and 36 can maintain potential states in the opposite directions.

The operation of this full latch circuit will be described. When, for example, the NMOS transistors N33 and N34 are simultaneously turned on, the node 36 is pulled down to low level by the NMOS transistor N34 on the output side, and hence logic L corresponding to the low level of the power supply voltage VL is output to the inverter 39.

When the NMOS transistors N33 and N34 are simultaneously turned off, both the nodes 35 and 36 are set in the floating state. At this time, if there is at least a slight potential difference between the nodes 35 and 36, the potential difference converges in a direction to increase, and the node 36 outputs a signal having one of the levels corresponding to the amplitude of the power supply voltage VL. Since a normal specified voltage is applied to the inverter 39, it operates normally. The level conversion circuit 14 therefore outputs the logic-fixed signal S4.

The operation of the semiconductor integrated circuit shown in FIG. 1 will be described in more detail below. When both the power supply voltages VL and VH to be applied are normal, the signal S1 having the amplitude corresponding to the power supply voltage VL output from the logic circuit 11 is input to the level conversion circuit 13. The level conversion circuit 13 performs L•H conversion described above to convert the signal S1 having the amplitude corresponding to the power supply voltage VL to a signal S2 having the amplitude corresponding to the power supply voltage VH, and outputs the signal S2. This signal S2 is input to the logic circuit 12, which in turn performs predetermined logic processing.

Meanwhile, the signal S3 having the amplitude corresponding to the power supply voltage VH output from the logic circuit 12 is input to the level conversion circuit 14. The level conversion circuit 14 performs H•L conversion described above to convert the signal S3 having the amplitude corresponding to the power supply voltage VH into a signal S4 having the amplitude corresponding to the power supply voltage VL, and outputs the signal S4. This signal S4 is input to the logic circuit 11, which in turn performs predetermined logic processing.

If one of the power supply voltages VL and VH changes, the following operation is performed.

When, for example, the power supply voltage VL is unstable and undergoes a change such as an instantaneous interruption or stop, the logic circuit 11 to which the power supply voltage VL is applied outputs the logic-undefined signal S1 to the level conversion circuit 13. The level conversion circuit 13 uses the full latch circuit shown in FIG. 2, and hence can prevent a leakage current from flowing in the full latch circuit to which the power supply voltage VH is applied. In addition, since a logic-fixed signal having the amplitude corresponding to the power supply voltage VH is input to the inverter 29 in FIG. 2, there is no chance that a leakage current will flow in the inverter 29. Since the normal specified voltage VH is applied to the inverter 29, it outputs a logic-defined signal. For this reason, no leakage current flows in the logic circuit 12 which operates at the power supply voltage VH.

In addition, since the normal power supply voltage VH is applied to the logic circuit 12, it outputs the logic-defined signal S3 to the level conversion circuit 14.

The operation of the level conversion circuit 14 in FIG. 3 will be described. Since the power supply voltage VH is applied to the inverters 37 and 38 attached to the full latch circuit of the level conversion circuit 14, a signal having normal logic level is output. If, for example, the signal S3 is at logic L, the NMOS transistor N33 is turned on, and the NMOS transistor N34 is turned off. In this case, since the node 35 is reliably set at ground potential, the NMOS transistor N32 is turned off, and the PMOS transistor P32 is turned on.

If the unstable state of the power supply voltage VL is an instantaneous interruption or stop state, the potential of the node 36 can be thought to be slightly higher than that of the node 35 although not so low as ground potential which is equal to the potential of the node 35. The NMOS transistor N31 will also be turned off at a very high possibility.

In contrast, if the signal S3 is at logic H, the NMOS transistor N33 is turned off, and the NMOS transistor N34 is turned on. In this case, the node 36 is reliably set at ground potential, and the NMOS transistor N31 is turned off. In this case, the potential of the node 35 becomes unstable. However, for the same reason as that described above, the NMOS transistor N32 will also be turned off at a high possibility.

As described above, even if the power supply voltage VL is unstable, almost no leakage current flows in the level conversion circuit 14.

When the NMOS transistor N34 is kept on by an H-level output from the inverter 38, the potential of the node 36 is set at low level. However, since the power supply voltage VL to the inverter 39 is unstable, the signal S4 becomes undefined. On the other hand, when the NMOS transistor N34 is kept off, since the unstable power supply voltage VL is applied to the node 36, a signal having the unstable amplitude VL is output. That is, if a logic circuit is connected to the output stage of a level conversion circuit, and the power supply voltage applied to the logic circuit changes, an output signal having the unstable amplitude VL is output regardless of an output signal from the full latch circuit on the input stage.

In most cases, however, such an unstable state is an instantaneous interruption or stop. Therefore, the power supply voltage VL will be a very low voltage, and an output signal is often set at low level. That is, this full latch circuit outputs a signal having level close to the low level of the power supply voltage VL.

Note that even if a logic-undefined signal is input to the inverter 39 and logic circuit 11, since the power supply voltage VL to be applied is low, no leakage current flows.

Even if, therefore, one power supply voltage VL becomes unstable, this embodiment can reliably prevent a leakage current from flowing in a logic circuit or the like to which the power supply voltage VH kept as the normal specified voltage is applied, and can also prevent a leakage current from flowing in the semiconductor integrated circuit as a whole, thereby reducing unnecessary consumption of power.

Although the unstable power supply voltage VL is applied to the logic circuit 15 at this time, since the unstable state of the power supply voltage VL can be thought to be an instantaneous interruption or stop state in most cases, a signal having logic level corresponding to the low level of the power supply voltage VL is output. Thus, there is no possibility that a leakage current will flow.

Assume that the power supply voltage VH is unstable and undergoes a change, e.g., becoming lower than the normal power supply voltage VL due to an instantaneous interruption or the like. In this case, the logic circuit 12 to which the power supply voltage VH is applied outputs the logic-undefined signal S3 to the level conversion circuit 14. The level conversion circuit 14 uses the full latch circuit shown in FIG. 3, and hence can prevent a leakage current from flowing in the full latch circuit to which the power supply voltage VL is applied. In addition, since a logic-fixed signal having the amplitude corresponding to the power supply voltage VL is input to the inverter 39 in FIG. 3, there is no possibility either that a leakage current will flow in the inverter 39. Since the power supply voltage VL equal to the normal specified voltage is applied to the inverter 39, the logic-defined signal S4 is output. For this reason, no leakage current flows in the logic circuit 11 which operates at the power supply voltage VL.

In addition, since the normal power supply voltage VL is applied to the logic circuit 11, the logic-defined signal S1 is output to the level conversion circuit 13.

The operation of the level conversion circuit 13 shown in FIG. 2 will be described next. Since the power supply voltage VL is normal and is applied to the inverters 27 and 28 attached to the full latch circuit of the level conversion circuit 13, a signal having normal logic level is output. If, for example, the signal S1 is at logic L, the NMOS transistor N23 is turned on, and the NMOS transistor N24 is turned off. In this case, since the node 25 is reliably set at ground potential, the NMOS transistor N22 is turned off, and the PMOS transistor P22 is turned on.

In this case, if an instantaneous interruption or stop state is considered as a factor that makes the power supply voltage VH become unstable as in the case of the power supply voltage VL, the potential of the node 26 can be thought to be slightly higher than that of the node 25 although not so low as ground potential which is equal to the potential of the node 25. The NMOS transistor N21 will also be turned off at a very high possibility.

In contrast, if the signal S is at logic H, the NMOS transistor N23 is turned off, and the NMOS transistor N24 is turned on. In this case, the node 26 is reliably set at ground potential, and the NMOS transistor N21 is turned off. In this case, the potential of the node 25 becomes unstable. However, for the same reason as that described above, the NMOS transistor N22 will also be turned off at a high possibility.

As described above, even if the power supply voltage VH is unstable, almost no leakage current flows in the level conversion circuit 13.

When the NMOS transistor N24 is kept on by an H-level output from the inverter 28, the potential of the node 26 is set at low level. However, since the power supply voltage VH to the inverter 29 is unstable, the signal S2 becomes undefined. On the other hand, when the NMOS transistor N24 is kept off, since the unstable power supply voltage VH is applied to the node 26, a signal having the unstable amplitude VH is output. That is, if a logic circuit is connected to the output stage of a level conversion circuit, and the power supply voltage applied to the logic circuit changes, an output signal having the unstable amplitude VL is output regardless of an output signal from the full latch circuit on the input stage. That is, if a logic circuit is connected to the output stage of a level conversion circuit, and the power supply voltage applied to the logic circuit changes, an output signal having the unstable amplitude VH is output regardless of an output signal from the full latch circuit on the input stage.

In most cases, such an unstable state is an instantaneous interruption or stop. Therefore, the power supply voltage VH will be a very low voltage, and an output signal is often set at low level. That is, this full latch circuit outputs a signal having level close to the low level of the power supply voltage VL.

Note that even if a logic-undefined signal is input to the inverter 29 and logic circuit 12, since the unstable state of the applied power supply voltage VL is thought to be an instantaneous-interruption or stop, and the power supply voltage VL to be applied is low, there is no possibility that a leakage current will flow.

As described above, even if one power supply voltage VH becomes unstable, this embodiment can reliably prevent a leakage current from flowing in a logic circuit or the like to which the power supply voltage VL kept as the normal specified voltage is applied, and can also prevent a leakage current from flowing in the semiconductor integrated circuit as a whole, thereby reducing unnecessary consumption of power.

Although a signal is input from the logic circuit 15 to the logic circuit 11 at this time, since the normal power supply voltage VL is applied, there is no possibility that a leakage current will flow. In addition, the logic circuit 15 can output a signal at normal logic level to the logic circuit 11.

As described above, even if one of the two power supply voltages VL and VH becomes unstable, as long as a normal specified voltage is applied from the other power supply, a logic circuit to which the normal power supply voltage is applied and a level conversion circuit having a full latch circuit for supplying a level conversion output to the logic circuit operate in accordance with signals at normal logic level. This makes it possible to prevent a leakage current from flowing in these circuits and greatly reduce the leakage current flowing in the overall semiconductor integrated circuit, thereby reducing the power consumption.

Figure 4:
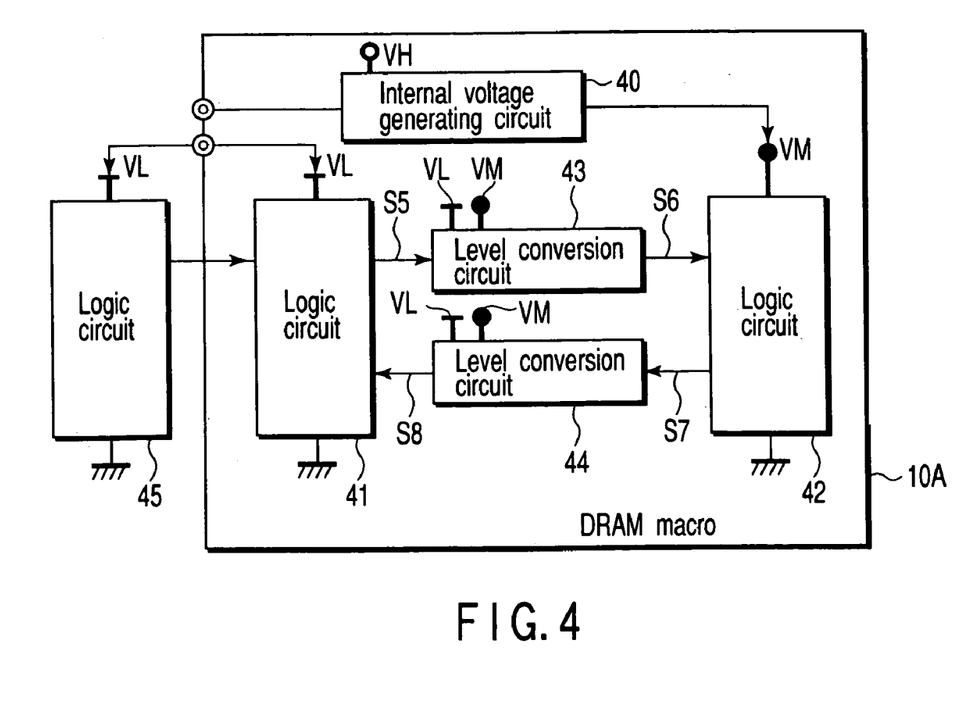
FIG. 4 is a block diagram showing the arrangement of a semiconductor integrated circuit according to the second embodiment of the present invention.

FIG. 4 is a block diagram showing the arrangement of the second embodiment. In this embodiment, a power supply voltage VM between a power supply voltage VL and a power supply voltage VH is applied to a logic circuit 42. This power supply voltage is applied from the power supply terminal indicated by the bullet in FIG. 4.

As shown in FIG. 4, in the semiconductor integrated circuit according to this embodiment, the power supply voltages VL and VH are externally applied to a DRAM macro 10A formed on a silicon substrate. The following circuits are formed in this DRAM macro 10A: an internal voltage generating circuit 40 for generating the internal voltage VM lower than the power supply voltage VH and higher than the power supply voltage VL, a logic circuit 41 to which the power supply voltage VL is applied and which outputs a signal S5 having the amplitude corresponding to the power supply voltage VL, a level conversion circuit 43 to which the power supply voltage VL and internal voltage VM are applied and which converts the output signal S5 from the logic circuit 41, which has the amplitude corresponding to the power supply voltage VL, into a signal S6 having the amplitude corresponding to the internal voltage VM, the logic circuit 42 to which the internal voltage VM is applied and which outputs a signal S7 having the amplitude corresponding to the internal voltage VM, and a level conversion circuit 44 to which the power supply voltage VL and internal voltage VM are applied and which converts the output signal S7 from the logic circuit 42, which has the amplitude corresponding to the internal voltage VM, into a signal S8 having the amplitude corresponding to the voltage VL.

In addition, a logic circuit 45 to which the power supply voltage VL is applied and which is directly connected to the logic circuit 41 is formed outside the DRAM macro 10A within the same semiconductor substrate.

Note that the level conversion circuit 43 corresponds to the level conversion circuit 13 in FIG. 2, and the level conversion circuit 44 corresponds to the level conversion circuit 14 in FIG. 3. With regard to a description of operation and reference figures, since the arrangement and operation of these circuits are the same as the circuits described above, as indicated by the above correspondence, except that the power supply voltage VM is applied instead of the power supply voltage VH, a description thereof will be omitted.

The logic circuit 41 that uses the lower power supply voltage VL as an operating voltage includes, for example, a control circuit for controlling the DRAM macro 10A, a decoding circuit for decoding the addresses of a memory cell array, and the like. The logic circuit 42 that uses the higher power supply voltage VM as an operating voltage includes, for example, a sense amplifier and the like. The logic circuit 45 connected to the input stage of the logic circuit 41 includes, for example, an address buffer circuit.

The operation of the semiconductor integrated circuit according to the second embodiment shown in FIG. 4 will be described next with reference to FIGS. 2 to 4.

The power supply voltage VH is applied to the internal voltage generating circuit 40, which in turn generates the internal voltage VM higher than the power supply voltage VL and lower than the power supply voltage VH. The logic circuit 42 to which this internal voltage VM is applied outputs the signal S7 having the amplitude corresponding to the internal voltage VM to the level conversion circuit 44. The level conversion circuit 44 converts the signal S7 from the amplitude corresponding to the internal voltage VM to the amplitude corresponding to the power supply voltage VL to output the signal S8.

In contrast, the logic circuit 41 outputs the signal S5 having the amplitude corresponding to the power supply voltage VL to the level conversion circuit 43. This level conversion circuit 43 converts the signal S5 from the amplitude corresponding to the power supply voltage VL to the amplitude corresponding to the internal voltage VM to output the signal S6.

The logic circuit 45 formed outside the DRAM macro 10A outputs a signal having the amplitude corresponding to the power supply voltage VL to the logic circuit 41.

The operation of the semiconductor integrated circuit according to this embodiment in a case wherein one of the power supply voltages VM and ML changes will be described next.

When the power supply voltage VL is unstable and undergoes a change such as an instantaneous interruption or stop, the logic circuit 41 to which the power supply voltage VL is applied outputs the logic-undefined signal S5. This signal S5 is input to the level conversion circuit 43. Note that the level conversion circuit 43 is the same as that described above except that the internal voltage VM is applied to the full latch circuit and an inverter 29 instead of the power supply voltage VH, and hence a detailed description of the arrangement and operation of the circuit will be omitted. As described with reference to FIG. 2, therefore, since this level conversion circuit 43 also incorporates the full latch circuit, it can prevent a leakage current from flowing in the full latch circuit in spite of the application of the unstable power supply voltage VL. Since the stable power supply voltage VM is applied, no leakage current flows in the inverter 29. The specified voltage VM is applied to the inverter 29, and hence it outputs the logic-defined signal S6. For this reason, no leakage current flows in the logic circuit 42. In addition, since the normal internal voltage VM is applied to the logic circuit 42, it outputs the logic-defined signal S7 to the level conversion circuit 44.

For this reason, each transistor of the full latch circuit of the level conversion circuit 44 operates normally. However, since the applied power supply voltage VL is unstable, when an NMOS transistor N34 in FIG. 3 is ON, it outputs a low-level signal to a node 36, whereas when it is OFF, it outputs a signal having the amplitude corresponding to the unstable power supply voltage VL. At this time, the power supply voltage VL is in an instantaneous interruption or stop state, and hence is very low. That is, the output signal S8 is always at low level. Therefore, the full latch circuit of the level conversion circuit 44 outputs the low-level signal of the power supply voltage VL.

In addition, even if logic-undefined signals are input to an inverter 39 in FIG. 3 and the logic circuit 41 in FIG. 4, since the applied power supply voltage VL is low, no leakage current flows. The unstable power supply voltage VL is applied to the logic circuit 45, and hence the internal signal is also a logic-undefined signal. However, since the power supply voltage VL is very low, no leakage current flows in the logic circuit 45.

In the embodiment shown in FIG. 4 as well, therefore, even if the power supply voltage VL is unstable, the semiconductor integrated circuit can reliably prevent a leakage current from flowing in the logic circuit 42 to which the power supply voltage VM kept at the specified voltage is applied and the like, thus greatly reducing a leakage current in the overall semiconductor integrated circuit. This makes it possible to reduce unnecessary consumption of power.

Although the unstable power supply voltage VL is applied to the logic circuit 45 at this time, since the unstable state of the power supply voltage VL can be thought to be an instantaneous interruption or stop state in most cases, a signal having a logic level corresponding to the low level of the power supply voltage VL is output. In addition, there is no possibility that a leakage current will flow.

A case wherein the amplitude of the internal voltage VM has changed upon a change in the power supply voltage VH will be described next. The unstable power supply voltage VH is applied to the internal voltage generating circuit 40. For this reason, the internal voltage generating circuit 40 outputs the unstable internal voltage VM. This unstable internal voltage VM is applied to the logic circuit 42, and hence the logic circuit 42 outputs the logic-undefined signal S7. This signal is input to the level conversion circuit 44. Note that the arrangement and operation of the level conversion circuit 44 are the same as those described above except that the power supply voltage VH applied to the inverters 37 and 38 shown in FIG. 3 is replaced with the internal voltage VM.

Since the level conversion circuit 44 uses the full latch circuit as described with reference to FIG. 3, it can prevent a leakage current from flowing in the full latch circuit to which the normal power supply voltage VL is applied. In addition, since a signal of stable logic levels corresponding to the power supply voltage VL is input to the inverter 39, no leakage current flows in the inverter 39 either. Therefore, the power supply voltage VL as the specified voltage is applied to the inverter 39, it outputs the correct logic signal S8. For this reason, the logic circuit 41 performs normal logic operation, and no leakage current flows in the logic circuit 41. In addition, since the normal power supply voltage VL is applied to the logic circuit 41, the signal S5 at correct logic level is output. No leakage current therefore flows in the level conversion circuit 43.

As described above, this embodiment can reliably prevent a leakage current from flowing in the logic circuit 41 to which the power supply voltage VL kept at the specified voltage is applied and reduce the leakage current in the overall semiconductor integrated circuit. This makes it possible to reduce unnecessary consumption of power.

Although a signal is input from the logic circuit 45 to the logic circuit 41, this is a signal having the stable amplitude corresponding to the power supply voltage VL whose levels are fixed. Since signals at stable logic levels are input to the logic circuit 45 and logic circuit 41, no leakage current flows therein. In addition, since the applied power supply voltage VL is held at the specified voltage, a logic-fixed signal is output from the logic circuit 41.

As described above, even if one of the two power supply voltages becomes unstable, since a circuit to which the other power supply voltage performs normal logic operation, a leakage current can be reliably prevented in the logic circuit to which this normal power supply voltage is applied, thereby reducing the leakage current flowing in the overall semiconductor integrated circuit. This makes it possible to reduce the power consumption.

The third embodiment in which the present invention is applied to a sense amplifier portion used in a dynamic RAM will be described below with reference to FIG. 5.

Figure 5:
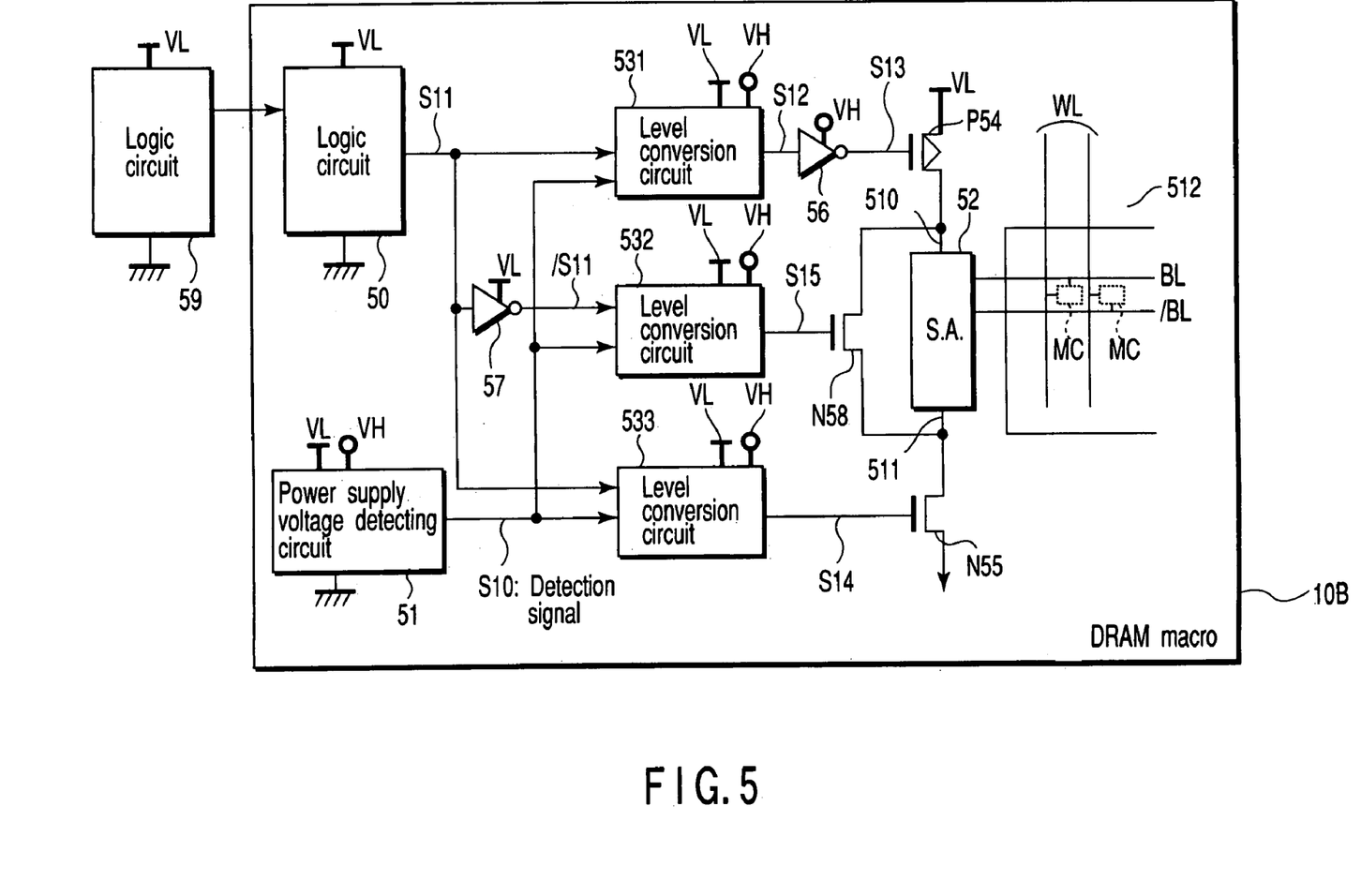
FIG. 5 is a block diagram showing the arrangement of a semiconductor integrated circuit according to the third embodiment of the present invention.

Referring to FIG. 5, a lower power supply voltage VL which is used to reduce the power consumption and a power supply voltage VH higher than the power supply voltage VL is applied to a DRAM macro 10B on a semiconductor substrate.

As shown in FIG. 5, a semiconductor integrated circuit of this embodiment includes a logic circuit 50 to which the power supply voltage VL is applied and which outputs an output signal S11 to level conversion circuits 531, 532, and 533, and a power supply voltage detecting circuit 51. The power supply voltages VL and VH are applied to this power supply voltage detecting circuit 51. When the specified power supply voltages VL and VH are applied to the power supply voltage detecting circuit 51, it outputs a high-level signal having the amplitude corresponding to the power supply voltage VL. When one of the power supply voltages VL and VH applied to the power supply voltage detecting circuit 51 changes, it detects this change and outputs a low-level detection signal having the amplitude corresponding to the power supply voltage VL to the level conversion circuits 531, 532, and 533.

The level conversion circuits 531, 532, and 533 receive not only the logic output signal S11 from the logic circuit 50 but also the detection signal S10 from the power supply voltage detecting circuit 51. In this case, the logic output signal S11 from the logic circuit 50 is supplied as an inverted signal via an inverter 57 only when it is supplied to the level conversion circuit 532.

The power supply voltages VH and VL are applied to these level conversion circuits 531, 532, and 533, which in turn convert the level of the signal S11 input from the logic circuit 50, which has the amplitude corresponding to the power supply voltage VL, into the level of a signal having the amplitude corresponding to the power supply voltage VH. As will be described in detail later, these level conversion circuits 531, 532, and 533 are designed to output a signal having one of the level corresponding to the amplitudes of the power supply voltage VH when one of the power supply voltages VH and VL changes.

The level conversion circuit 531 outputs an output signal S12. This signal S12 is supplied to an inverter 56 driven by the power supply voltage VH so as to invert its logic. As a result, a signal S13 having the amplitude corresponding to the power supply voltage VH is output.

The inverter 56 is connected to the gate terminal of a PMOS transistor P54. The source terminal of the PMOS transistor P54 is connected to the power supply voltage VL, and the drain terminal is connected to one power supply terminal of a sense amplifier 52. This PMOS transistor P54 is turned off by a signal having logic H level corresponding to the amplitude of the power supply voltage VH applied to the gate terminal.

A signal S14 is output from the output terminal of the level conversion circuit 533. This output terminal is connected to the gate terminal of an NMOS transistor N55. The source terminal of the NMOS transistor N55 is connected to the power supply terminal of the power supply voltage VL, and the drain terminal is connected to the other power supply terminal or line of the sense amplifier 52. The NMOS transistor N55 is turned on when a signal having logic H level corresponding to the power supply voltage VH from the level conversion circuit 533 is supplied to the gate terminal, and is turned off by a logic-L signal.

The power supply voltage VL is applied to the sense amplifier 52 when both the PMOS transistor P54 and the NMOS transistor N55 are turned on. This sense amplifier 52 has signal input terminals connected to, for example, bit lines BL and /BL of a cell array 512 having a plurality of memory cells MC arrayed in the form of a matrix at the intersections of word lines WL connected to address signal input terminals and the bit lines BL and /BL.

The inverter 57 has an input terminal to which the signal S11 from the logic circuit 50 is input, and outputs the signal /S11 obtained by inverting the logic of the signal S11 to the level conversion circuit 532. The level conversion circuit 532 receives the inverted signal /S11 from the inverter 57 and outputs a level conversion signal S15 to the gate terminal of an NMOS transistor N58.

The NMOS transistor N58 has source and drain terminals connected between power supply lines or terminals 510 and 511 of the sense amplifier 52. When both the PMOS transistor P54 and the NMOS transistor N55 are OFF and the high-level signal S15 having the amplitude corresponding to the power supply voltage VH is input to the gate terminal, the NMOS transistor N58 is turned on. As a result, the charge left on the power supply lines of the sense amplifier 52 is removed via the NMOS transistor N58, and the potentials of power supply lines of the sense amplifier 52 are equalized.

A logic circuit 59 to which the power supply voltage VL is applied and which is so connected to the logic circuit 50 as to supply a logic signal to it is formed outside the DRAM macro 10B.

The arrangement and operation of the level conversion circuit 531 as an example used in the embodiment shown in FIG. 5 will be described next with reference to FIG. 6. Note that the remaining level conversion circuits 532 and 533 have the same arrangement.

Figure 6:
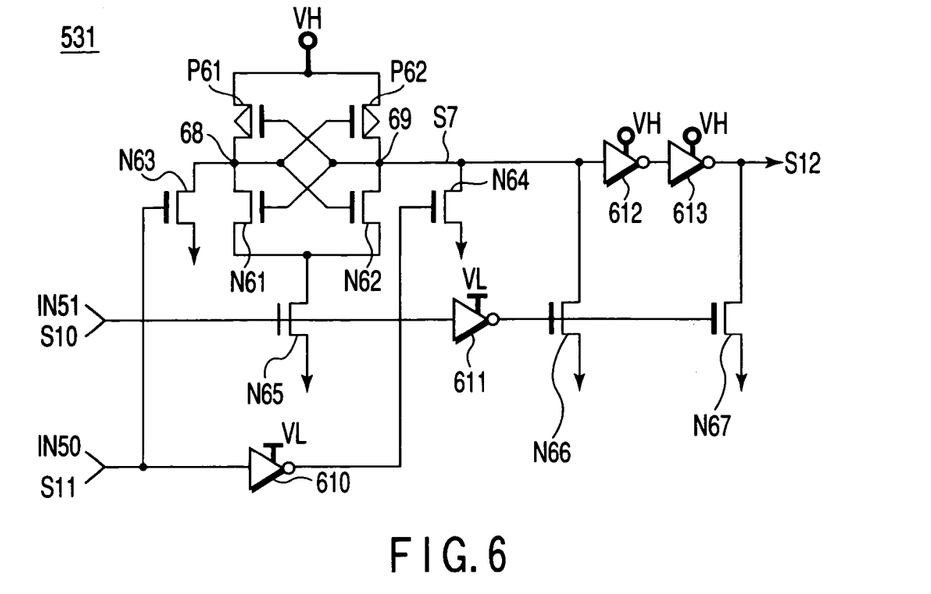
FIG. 6 is a circuit diagram showing an example of the arrangement of a level conversion circuit used in the third embodiment of the present invention.

Referring to FIG. 6, the full latch circuit included in the level conversion circuit 531 is comprised of two PMOS transistors P61 and P62 and two NMOS transistors N61 and N62. The sources of the PMOS transistors P61 and P62 are connected to a higher voltage power supply terminal for the power supply voltage VH. At a node 68, these sources are connected to the drain terminal of the NMOS transistor N61, and are also commonly connected to the gates of the NMOS transistor N61 and PMOS transistor P62.

The drain terminal of the PMOS transistor P62 is connected to the drain terminal of the NMOS transistor N62 at the node 69, and is commonly connected to the gates of the NMOS transistor N61 and PMOS transistor P61. The sources of the NMOS transistors N61 and N62 are commonly connected to ground via an NMOS transistor N65.

In addition to this full latch circuit, the level conversion circuit 531 further includes a logic signal input terminal IN50 to which the signal S11 of power supply voltage VL level is input from the logic circuit 50 and an input terminal IN51 to which a detection signal S10 of power supply voltage VL level is input from the power supply voltage detecting circuit 51.

The input terminal IN50 is connected to the gate terminal of an NMOS transistor N63 and also connected to the gate terminal of an NMOS transistor N64 via an inverter 610 energized by the power supply voltage VL. The drain terminal of the NMOS transistor N63 is connected to the node 68. The drain terminal of the NMOS transistor N64 is connected to a node 69.

The input terminal IN51 to which a detection signal S10 from the power supply voltage detecting circuit 51 is supplied is connected to the input terminal of an inverter 611 energized by the power supply voltage VL via the gate of the NMOS transistor N65. The output terminal of the inverter 611 is commonly connected to the gates of NMOS transistors N66 and N67.

The drain terminal of the NMOS transistor N66 is connected to the node 69, and the source terminal is grounded. The node 69 is connected to an inverter 612 to which the power supply voltage VH is applied and which has an input terminal to which an output signal from the full latch circuit is input via the node 69. The output terminal of the inverter 612 is connected to the input terminal of an inverter 613 to which the power supply voltage VH is applied. The output terminal of the inverter 613 is connected to the drain of the NMOS transistor N67. The source terminal of this NMOS transistor N67 is grounded.

An example of the circuit arrangement of the sense amplifier 52 to which the embodiment shown in FIG. 5 is applied will be described below with reference to FIG. 7.

Figure 7:
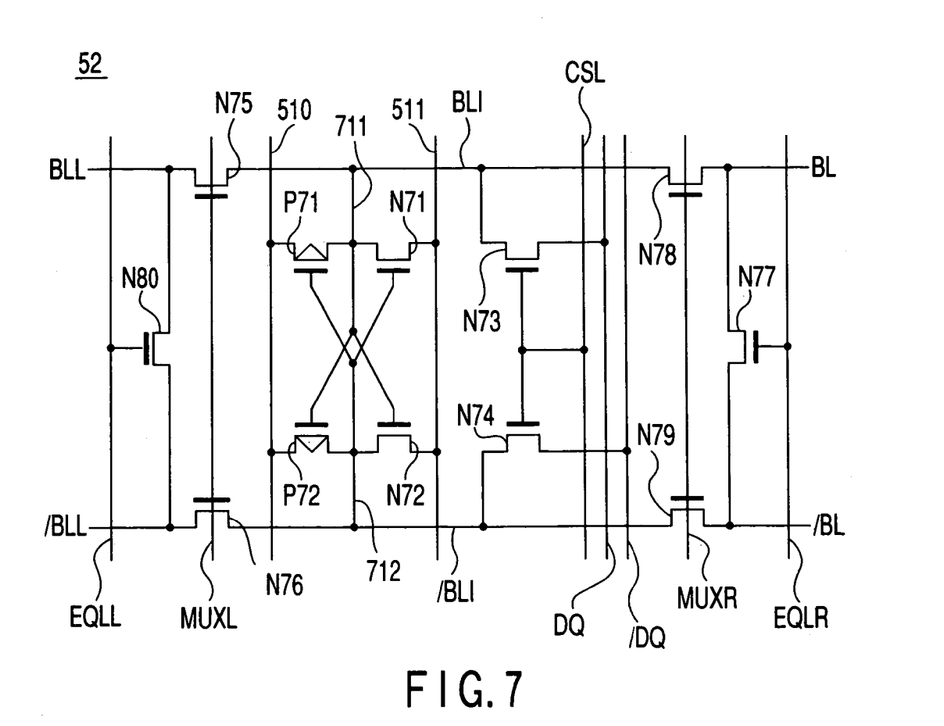
FIG. 7 is a circuit diagram showing an example of the arrangement of a sense amplifier circuit according to the third embodiment shown in FIG. 5.

Referring to FIG. 7, in the sense amplifier 52, one bit line BLI is commonly connected to the gates of a PMOS transistor P72 and NMOS transistor N72 at a node 711 and also commonly connected to the drains of a PMOS transistor P71 and NMOS transistor N71.

The other bit line /BLI is commonly connected to the gates of the PMOS transistor P71 and NMOS transistor N71 at a node 712 and also commonly connected to the drains of the PMOS transistor P72 and NMOS transistor N72.

Sense amplifier driving lines 510 and 511 are respectively connected to the source and drain terminals of the NMOS transistor N58 of FIG. 5 serving as an equalizing element.

One end of this bit line BLI is connected to the bit line BL via an NMOS transistor N78 whose gate is connected to one shared selection signal line MUXR. The other end of the bit line BLI is connected to the bit line BLL via an NMOS transistor N75 whose gate is connected to the other shared selection signal line MUXL.

One end of the other bit line /BLI is connected to the bit line /BL via an NMOS transistor N79 whose gate is connected to one shared selection signal line MUXR. The other end of the bit line BLI is connected to the bit line /BLL via an NMOS transistor N76 whose gate is connected to the other shared selection signal line MUXL.

The pair of bit lines BLI and /BLI are respectively connected to a pair of local data lines DQ1 and DQ2 via NMOS transistors N73 and N74 whose gates are connected to a column selection line CSL.

An NMOS transistor N77 whose gate is connected to one equalize signal line EQLR is connected between the pair of bit lines BL and /BL. An NMOS transistor N80 whose gate is connected to the other equalize signal line EQLL is connected between the par of bit lines BLL and /BLL.

Note that a detailed description of a driver circuit for driving the signal lines EQLR, EQLL, MUXR, MUXL, and CSL will be omitted.

The operation of this embodiment will be described next with reference to FIGS. 5 to 7.

A case wherein the sense amplifier 52 is operated to amplify the signal read out from a memory cell MC and supplied from the pair of bit lines BLI and /BLI will be described first.

In order to operate the sense amplifier 52, the power supply voltage VL must be applied to the sense amplifier 52 via the PMOS transistor P54 and NMOS transistor N55. For this purpose, the logic circuit 50 outputs the logic-H signal S11 having the amplitude corresponding to the power supply voltage VL. Note that, for example, the logic circuit 50 outputs the logic-H signal S11 having the amplitude corresponding to the power supply voltage VL in accordance with a signal from the logic circuit 59 formed outside the DRAM macro 10B.

When the two power supply voltages VL and VH are normal and fall within the specified value range, the power supply voltage detecting circuit 51 outputs a logic-H detection signal S10 having the amplitude corresponding to the power supply voltage VL. This signal S11 and detection signal S10 are supplied to the level conversion circuits 531, 532, and 533.

As shown in FIG. 6, for example, the logic-H detection signal S10 input to the level conversion circuit 531 is input from the input terminal IN51 to the gate terminal of the NMOS transistor N65 to turn on the NMOS transistor N65. In addition, the detection signal is input to the inverter 611 to be inverted into logic L level. This signal of logic L level is input to the gate terminals of the NMOS transistors N66 and N67 to turn off the NMOS transistors N66 and N67.

The logic circuit 50 supplies the signal S11 having logic H level corresponding to power supply voltage VL to the input terminal IN50. This signal S11 is input to the gate of the NMOS transistor N63 and the inverter 610. The NMOS transistor N63 is turned on by the logic-H signal input to its gate. Meanwhile, the logic-H signal S11 input to the input terminal of the inverter 610 is inverted into a logic-L signal /S11 and input to the gate of the NMOS transistor N64 to turn it off.

As a consequence, a node 68 connected to the drain of the NMOS transistor N63 is pulled down to low level, and the PMOS transistor P62 having a gate to which the potential of the node 68 is input is turned on. At the same time, the NMOS transistor N62 having a gate to which the potential of the node 68 is input is turned off.

When the NMOS transistor N64 is turned off, the potential of a node 69 is pulled up to the power supply voltage VH. For this reason, the PMOS transistor P61 having a gate to which the potential of the node 69 is input is turned off, and at the same time, the NMOS transistor N61 having a gate to which the potential of the node 69 is input is turned on. Therefore, the node 69 is set at the potential equal to the power supply voltage VH.

In this case, as described above, since the NMOS transistor N66 connected to the node 69 is OFF, a signal at power supply voltage VH level is supplied to the output node via the inverters 612 and 613 to which the power supply voltage VH is applied. Since the NMOS transistor N67 connected to this output node is also OFF, the output node is at the potential equal to the power supply voltage VH, and the level conversion circuit 531 outputs the signal S12 having logic H level corresponding to the power supply voltage VH.

Note that the remaining level conversion circuits 532 and 533 have the arrangement shown in FIG. 6 like the level conversion circuit 531 and operate in the same manner.

The level conversion circuit 531 shown in FIG. 5 outputs the signal S12 having logic H level corresponding to power supply voltage VH to the inverter 56 connected to the output terminal. The inverter 56 inverts the logic of the signal S12 to output the signal S13 having logic L level corresponding to power supply voltage VH. This signal S13 is input to the gate terminal of the PMOS transistor P54 to turn on the PMOS transistor P54.

Since the level conversion circuit 533 outputs the signal S14 having logic H level corresponding to power supply voltage VH to the gate terminal of the NMOS transistor N55, the NMOS transistor N55 is also turned on. As a consequence, the power supply voltage VL is applied to the sense amplifier 52, and the sense amplifier 52 is activated.

In this embodiment, the signals S13 and S14 having the amplitude corresponding to the power supply voltage VH are supplied to the gate terminals of the PMOS transistor P54 and NMOS transistor N55. By supplying the signals S13 and S14 having the amplitude corresponding to power supply voltage VH in this manner, the transistors P54 and N55 are set in a sufficient ON state. With this operation, the power supply voltage VL is sufficiently applied to the sense amplifier 52 to allow it to operate without decreasing the operation speed.

The inverter 57 is connected to the input side of the level conversion circuit 532 to which the signal S11 is input. This inverter 57 inverts the logic of the signal S11 from the logic circuit 50 and outputs the resultant signal. Therefore, the signal having logic L level corresponding to power supply voltage VL is input to the level conversion circuit 532. Since this logic-L signal /S11 is supplied to the input terminal IN50 in FIG. 6, the NMOS transistor N63 on the input side of the full latch circuit is turned off, and the NMOS transistor N64 is turned on in contrast to the case of the level conversion circuits 531 and 533.

As a consequence, when the transistors P54 and N55 are turned on by the output signals S13 and S14 from the level conversion circuits 531 and 533, the NMOS transistor N58 is turned off by the output signal S15 from the level conversion circuit 532, and the sense amplifier 52 is activated. In contrast, when the transistors P54 and N55 are turned off by the output signals S13 and S14 from the level conversion circuits 531 and 533, the transistor N58 is turned on by the output signal S15 from the level conversion circuit 532, and the sense amplifier 52 is inactivated. The potential of the power supply circuit for the sense amplifier 52 is then equalized by the transistor N58.

The operation of the level conversion circuits 531, 532, and 533 will be described in a case wherein the signal S11 having logic L level corresponding to power supply voltage VL is input to the input terminals of the level conversion circuits 531 to 533 on the logic circuit 50 side, and the signal S10 having logic H level corresponding to power supply voltage VL is input to the input terminals on the power supply voltage detecting circuit 51 side.

First of all, the transistor N65 is turned on, and the transistors N66 and N67 are turned off by a detection signal from the power supply voltage detecting circuit 51, as described above.

Meanwhile, the signal having logic L level corresponding to power supply voltage VL from the logic circuit 50 is supplied to the gate of the transistor N63 and the inverter 610. The logic-L signal supplied to the gate of the transistor N63 turns off the transistor N63.

Meanwhile, the logic-L signal supplied to the input terminal of the inverter 610 inverted into a logic-H signal, which is in turn supplied to the gate of the transistor N64 to turn on the transistor N64. The node 69 connected to the drain of the transistor N64 is pulled down to low level, and the transistor P61 having a gate to which the potential of the node 69 is input is turned on. At the same time, the transistor N61 having a gate to which the potential of the node 69 is input is turned off.

In addition, the potential of the node 68 is pulled up to high level corresponding to the power supply voltage VH. The transistor P62 having a gate to which the potential of the node 68 is input is turned off. At the same time, the transistor N62 having a gate to which the potential of the node 69 is input is turned on. Therefore, the node 69 has a low-level corresponding to the amplitude of the power supply voltage VH.

Since the transistor N66 connected to the node 69 is OFF, the signal having logic L level corresponding to power supply voltage VH is supplied to the inverters 612 and 613 to which the power supply voltage VH is applied. Since the transistor N67 connected to the output node is also OFF, the level conversion circuits 531 and 533 respectively output signals having logic H level corresponding to power supply voltage VH. The signal S13 having logic H level corresponding to power supply voltage VH which is output from the level conversion circuit 531 is converted into logic L level to turn on the transistor P54. The signal S14 having logic H level corresponding to power supply voltage VH which is output from the level conversion circuit 533 turns on the transistor N55.

Since the level conversion circuit 532 outputs the signal S15 having logic L level corresponding to power supply voltage VH, the transistor N58 is turned off. When, therefore, the transistors P54 and N55 are turned on by the output signals S13 and S14 from the level conversion circuits 531 and 533, the transistor N58 is turned off by the output signal S15 from the level conversion circuit 532, and the sense amplifier 52 is activated. When the sense amplifier 52 is activated, the transistor N58 performs no equalizing operation for power supply line potential.

The operation of this embodiment in a case wherein the potential of the power supply voltage VL applied to the sense amplifier 52 on the power supply terminal is equalized will be described next.

In order to equalize the potential on the power supply line, the logic circuit 50 outputs the logic-L signal S11 having an amplitude corresponding to power supply voltage VL.

The signal S11 having logic L level corresponding to the power supply voltage VL is input from the logic circuit 50 to the level conversion circuits 531 and 533, and the signal S10 having logic H level corresponding to the power supply voltage VL is input from the power supply voltage detecting circuit 51 to the level conversion circuits. With this operation, as described above, the signals S13 and S14 having logic L level corresponding to power supply voltage VH are output.

Meanwhile, the signal /S11 having logic H level corresponding to the power supply voltage VL, which is obtained by logic inversion by the inverter 57, is input to the level conversion circuit 532, and a signal having logic H level corresponding to the power supply voltage VL is input from the power supply voltage detecting circuit 51 to the level conversion circuit. With this operation, as described above, the signal S15 having logic H level corresponding to power supply voltage VH is output.

When, therefore, the transistors P54 and N55 are turned off by the output signals S13 and S14 from the level conversion circuits 531 and 533, the transistor N58 is turned on by the output signal S15 from the level conversion circuit 532, and the sense amplifier 52 is inactivated. The potential of the power supply circuit for the sense amplifier 52 is then equalized by the transistor N58.

A case wherein the power supply voltage detecting circuit 51 detects that one of the power supply voltages VH and VL falls outside the specified voltage range will be described below.

A case wherein the power supply voltage VH is unstable and becomes lower than the power supply voltage VL will be described first.

Upon detection of a change in the power supply voltage VH, the power supply voltage detecting circuit 51 outputs a detection signal having logic L level corresponding to power supply voltage VL. This logic-L detection signal is input to the transistors N65 of the level conversion circuits 531, 532, and 533 to turn off the transistors N65. With this operation, the power supply voltage VH is not applied to the full latch circuit, and the full latch circuit cannot perform normal operation. However, as described above, in spite of the fact that the applied power supply voltage VH changes, a leakage current can be prevented from flowing through the full latch circuit. This makes it possible to reduce unnecessary consumption of power.

The detection signal is inverted into logic H by the inverter 611 to turn on the transistors N66 and N67. The node 69 connected to the transistor N66 and the output node connected to the transistor N67 are pulled down to ground potential. Therefore, the level conversion circuits 531, 532, and 533 output ground-potential signals regardless of the output signal from the logic circuit 50. That is, all the level conversion circuits 531, 532, and 533 output low-level signals corresponding to power supply voltage VH.

The signal S12 having logic L level output from the level conversion circuit 531 is input to the inverter 56. However, the logic of an output from the inverter 56 is not fixed because the changing power supply voltage VH is applied to the inverter. Note that since the logic of the input signal is fixed, no leakage current flows. In addition, this logic-undefined signal S13 is supplied to the transistor P54, and the conduction state of the transistor P54 also becomes unstable.

The signal S14 having logic L level output from the level conversion circuit 533 is input to the gate terminal of the transistor N55 to completely turn it off. For this reason, even if the conduction state of the transistor P54 is unknown, no power supply voltage VL is applied to the sense amplifier 52, and no leakage current flows in the sense amplifier 52.

The signal S15 having logic L level output from the level conversion circuit 532 turns off the transistor N58. For this reason, when the power supply voltage VH changes, no leakage current flows in the sense amplifier 52 and no current flows either via the transistor N58. Since the leakage current in the overall semiconductor integrated circuit is greatly reduced, unnecessary consumption of power can be reduced.

A case wherein the power supply voltage VL is unstable and instantaneously interrupted or stopped will be described next.

Upon detection of a change in the power supply voltage VL, the power supply voltage detecting circuit 51 outputs a detection signal having power supply voltage VL. Since this detection signal is generated by the changing power supply voltage VL, the signal is a logic-undefined signal. This logic-undefined detection signal is supplied to the level conversion circuits 531, 532, and 533 shown in FIG. 6. Since the changing power supply voltage VL is applied to the logic circuit 59, logic circuit 50, and inverter 57, logic-undefined signals are input to the input terminals of all the level conversion circuits 531, 532, and 533.

Since the logic-undefined input signal S11 from the logic circuit 50 is input to the gates of the transistors N63 and N64, the conduction states of these transistors N63 and N64 become undefined. For this reason, the potentials of the nodes 68 and 69 also become undefined.

If there is at least a slight potential difference between the nodes 68 and 69, the full latch circuit used for each of the level conversion circuits 531, 532, and 533 according to this embodiment can converge the potential difference in a direction to increase. Therefore, the potential states of the nodes 68 and 69 with the opposite polarities can be maintained.

The operation of this full latch circuit will be described. When, for example, the transistors N64 and N63 are simultaneously turned on, the node 69 is pulled down to low level by the transistor N64 on the output side. A low-level signal having the amplitude corresponding to the power supply voltage VH is therefore output to the inverter 612.

When the transistors N64 and N63 are simultaneously turned off, the potential difference between the nodes 68 and 69 converge in a direction to increase, and the node 69 outputs a signal having one of the amplitudes corresponding to power supply voltage VH level. The level conversion circuit shown in FIG. 6 is therefore designed such that no leakage current flows in the full latch circuit portion because of the convergence of the potential difference between the nodes 68 and 69 in a direction to increase.

The input signal from the power supply voltage detecting circuit 51 is a signal input when the power supply voltage VL is unstable and instantaneously interrupted or stopped, and hence its logic is at low level.

Consequently, the transistor N65 is turned off by the logic-L detection signal input to the transistor N65. This reliably prevents a leakage current from flowing in the full latch circuit. In addition, since the power supply voltage VL applied to the inverter 611 is instantaneously interrupted or stopped, the logic of the output signal is at low level without being inverted. Since the logic-L signal is input to the gates of the transistors N66 and N67, the two transistors are turned off.

The node 69 outputs a signal having one of the levels corresponding to the amplitude of the power supply voltage VH level output from the full latch circuit to the inverter 612. Since the specified voltage is applied to the inverters 612 and 613, they operate normally. The level conversion circuit 531 therefore outputs the logic-fixed signal S12.

The signal S12 is input to the inverter 56, which in turn outputs the signal S13 whose logic is inverted because the power supply voltage VH is applied to the inverter 56. Since the signal S14 output from the level conversion circuit 533 has the same polarity as that of the signal S12, the signals S13 and S14 become logic-inverted signals. The conduction states of the transistors P54 and N55 which receive these signals at their gates coincide with each other. Therefore, the transistors P54 and N55 can be simultaneously turned on.

However, since the applied power supply voltage VL is instantaneously interrupted or stopped, the transistor P54 is turned off. As a result, no leakage current flows in the sense amplifier 52, and no current flows either via the transistor N58. Therefore, the leakage current can be greatly reduced in the overall semiconductor integrated circuit. This makes it possible to reduce unnecessary consumption of power.

As described above, according to this embodiment, a semiconductor integrated circuit can be provided, in which no leakage current flows in the level conversion circuits, logic circuit elements, and sense amplifiers, even if the power supply voltage VL is unstable, the power consumption can be reduced, and no logic operation error occurs.

As has been described in detail above, according to the embodiments of the present invention, a semiconductor integrated circuit can be provided, in which even if one of different power supply voltages changes, and a signal with unstable logic is generated inside, a reduction in power consumption can be achieved by preventing a leakage current due to the unstable signal, and logic operation errors can be prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
   a first logic circuit to which a first power supply voltage having a first amplitude is applied and which outputs a first signal having the first amplitude;
   a first level conversion circuit to which the first power supply voltage and a second power supply voltage having a second amplitude different from the first amplitude are supplied and which converts levels of the first signal from the first amplitude to the second amplitude and outputs a second signal;

a second logic circuit to which the second power supply voltage having the second amplitude is applied and which outputs a third signal having the second amplitude; and a second level conversion circuit which is connected between the first and second logic circuits, to which the first and second power supply voltages are applied, and which converts the third signal having the second amplitude output from the second logic circuit into a fourth signal having the first amplitude, wherein at least the first and second logic circuits are formed on a single semiconductor substrate, and wherein the first level conversion circuit has a first full latch circuit comprising a first circuit including a first PMOS transistor and a first NMOS transistor which have current paths connected in series at a first node and gates connected to each other at a second node and are connected across power supply terminals of the second power supply voltage, a second circuit including a second PMOS transistor and a second NMOS transistor which have current paths connected in series at the second node and gates connected to each other at the first node and are connected across the power supply terminals of the second power supply voltage, a third NMOS transistor which has a gate to which the first signal is applied, the third NMOS transistor being connected between the first node and one of the power supply terminals of the second power supply voltage, and a fourth NMOS transistor which has a gate to which a logic signal having an opposite polarity to the first signal is applied, the fourth NMOS transistor being connected between the second node and one of the power supply terminals of the second power supply voltage, and the second level conversion circuit has a second full latch circuit comprising a third circuit including a third PMOS transistor and a fifth NMOS transistor which have current paths connected in series at a third node and gates connected to each other at a fourth node and are connected across power supply terminals of the first power supply voltage, a fourth circuit including a fourth PMOS transistor and a sixth NMOS transistor which have current paths connected in series at the fourth node and gates connected to each other at the third node and are connected across the power supply terminals of the first power supply voltage, a seventh NMOS transistor which has a gate to which the third signal is applied, the seventh NMOS transistor being connected between the third node and one of the power supply terminals of the first power supply voltage, and an eighth NMOS transistor which has a gate to which a logic signal having an opposite polarity to the third signal is applied, the eighth NMOS transistor being connected between the fourth node and one of the power supply terminals of the first power supply voltage.

2. The circuit according to claim 1, wherein the first level conversion circuit outputs the first signal upon fixing the level of the first signal to at least one of levels corresponding to the second amplitude, and the second level conversion circuit outputs the second signal upon fixing the level of the second signal to at least one of levels corresponding to the second amplitude.

3. The circuit according to claim 1, wherein the first and second level conversion circuits are formed on the single semiconductor substrate.

4. The circuit according to claim 2, wherein the first and second level conversion circuits are formed on the single semiconductor substrate.

* * * * *